United States Patent
Teranishi et al.

(10) Patent No.: US 12,322,655 B2
(45) Date of Patent: Jun. 3, 2025

(54) METHOD OF MANUFACTURING LAYERED DEVICE CHIP ASSEMBLY

(71) Applicant: DISCO CORPORATION, Tokyo (JP)

(72) Inventors: Shunsuke Teranishi, Tokyo (JP); Zhiwen Chen, Tokyo (JP); Kyosuke Kobinata, Tokyo (JP); Akihito Kawai, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 511 days.

(21) Appl. No.: 17/934,350

(22) Filed: Sep. 22, 2022

(65) Prior Publication Data
US 2023/0096486 A1    Mar. 30, 2023

(30) Foreign Application Priority Data
Sep. 29, 2021    (JP) .................. 2021-159814

(51) Int. Cl.
| | | |
|---|---|---|
| H01L 21/78 | (2006.01) | |
| H01L 21/56 | (2006.01) | |
| H01L 23/00 | (2006.01) | |

(52) U.S. Cl.
CPC ............ *H01L 21/78* (2013.01); *H01L 21/561* (2013.01); *H01L 21/568* (2013.01); *H01L 24/94* (2013.01); *H01L 24/96* (2013.01); *H01L 2224/94* (2013.01); *H01L 2224/96* (2013.01)

(58) Field of Classification Search
None
See application file for complete search history.

(56) References Cited

U.S. PATENT DOCUMENTS

| | | | | |
|---|---|---|---|---|
| 2012/0025355 A1* | 2/2012 | Sasaki | ............ | H01L 24/92 |
| | | | | 257/E23.179 |
| 2013/0105949 A1* | 5/2013 | Sasaki | ............ | H01L 24/96 |
| | | | | 438/460 |
| 2020/0381315 A1* | 12/2020 | Kawai | ............ | H01L 23/544 |
| 2022/0157667 A1* | 5/2022 | Kim | ............ | H01L 21/6835 |

FOREIGN PATENT DOCUMENTS

JP      2003249620 A      9/2003

* cited by examiner

*Primary Examiner* — Erik T. K. Peterson
(74) *Attorney, Agent, or Firm* — Greer Burns & Crain Ltd.

(57) ABSTRACT

A method of manufacturing a layered device chip assembly includes forming first grooves in a first wafer, fixing the first wafer to a support body, grinding the first wafer to expose the first grooves, forming a first resin layer in the first grooves, simultaneously polishing the first wafer and the first resin layer to expose the first resin layer, forming second grooves in the second wafer, the second grooves having a width on the face side larger than a width of the first grooves and a width at groove bottoms that is smaller than the width on the face side of the second wafer, affixing the second wafer to the first wafer, grinding the second wafer to expose the second grooves on the reverse side thereof, forming a second resin layer in the second grooves, and dividing the first wafer and the second wafer into a plurality of assemblies.

3 Claims, 15 Drawing Sheets

METHOD OF MANUFACTURING LAYERED DEVICE CHIP ASSEMBLY

BACKGROUND OF THE INVENTION

Field of the Invention

The present invention relates to a method of manufacturing a layered device chip assembly by layering device chips.

Description of the Related Art

To meet demands for thinner and smaller electronic devices, efforts have been made in the art to reduce the size of semiconductor devices for use in those electronic devices by way of finer patterning and device chip layering. For example, technologies such as direct bonding have been developed for layering device chips and bonding electrodes directly to each other (see, for example, JP 2003-249620A). According to direct bonding, a device surface, i.e., a functional layer surface or face side, of a device chip having through-silicon via (TSV) electrodes is directly placed on a reverse side of another device chip to be layered on the device chip, the device surface is processed into a flat surface so as not to have foreign matter trapped between the device chips.

SUMMARY OF THE INVENTION

When device chips having device surfaces whose areas are identical to each other are to be directly joined to each other, providing the space between adjacent device chips is filled with a layer of resin, the device chips and the layer of resin are polished in order to planarize them. Since the layer of resin is resilient, after the layer of resin has been polished, the layer of resin tends to rise slightly from the polished surfaces of the device chips and to be squeezed out from between the device chips. The layer of resin that has been squeezed out is likely to be trapped between the device chips to be layered one on the other, possibly preventing the device chips from being directly joined to each other.

It is therefore an object of the present invention to provide a method of manufacturing a layered device chip assembly of layered device chips while minimizing the risk of preventing the device chips from being neatly joined to each other.

In accordance with an aspect of the present invention, there is provided a method of manufacturing a layered device chip assembly of layered device chips from first and second wafers that are structurally identical to each other and each have a plurality of devices formed respectively in areas demarcated on a face side thereof by a plurality of intersecting projected dicing lines. The method includes a first groove forming step of forming first grooves in the first wafer along the projected dicing lines thereon to a depth beyond a finished thickness of a first device chip, a fixing step of fixing the face side of the first wafer to a support body, a first wafer grinding step of grinding the first wafer fixed to the support body from a reverse side thereof to expose the first grooves on the reverse side of the first wafer, a first resin layer forming step of forming a first resin layer in the first grooves in the first wafer, a first wafer polishing step of simultaneously polishing the first wafer fixed to the support body and the first resin layer to thin down the first wafer to a thickness commensurate with the finished thickness of the first device chip to expose the first resin layer in the first grooves on the reverse side of the first wafer, a second groove forming step of forming second grooves in the second wafer from the face side thereof along the projected dicing lines thereon to a depth beyond a finished thickness of a second device chip, the second groove having a width on the face side of the second wafer that is larger than a width of the first grooves and a width at groove bottoms that is smaller than the width on the face side of the second wafer, an affixing step of holding the reverse side of the polished first wafer and the face side of the second wafer in facing relation to each other and affixing the second wafer to the first wafer such that portions of the first resin layer that protrude from the reverse side of the first wafer are accommodated in the second grooves in the second wafer, a second wafer grinding step of grinding the second wafer affixed to the first wafer from the reverse side of the second wafer to expose the second grooves on the reverse side of the second wafer, a second resin layer forming step of forming a second resin layer in the second grooves in the second wafer, and a dividing step of cutting the first resin layer and the second resin layer along the first grooves and the second grooves to divide the first wafer and the second wafer into a plurality of layered device chip assemblies.

Preferably, the second groove forming step includes a step of forming the second grooves according to a plasma etching process using a plasmatic gas, a cutting process using a cutting blade, or a laser processing process using a laser beam.

Preferably, the method further includes, after the second resin layer forming step and before the dividing step, a second wafer polishing step of simultaneously polishing the second wafer affixed to the first wafer and the second resin layer to thin down the second wafer to a thickness commensurate with the finished thickness of the second device chip.

The present invention is advantageous in that it allows the first and second device chips to be joined neatly to each other rather than obstructing the joining of the first and second device chip.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

Preferred embodiments of the present invention will be described in detail hereinbelow with reference to the accompanying drawings. The present invention is not limited to the details of the embodiments described below. The components described below cover those which could easily be anticipated by those skilled in the art and those which are essentially identical to those described above. Furthermore, the arrangements described below can be combined in appropriate manners. Various omissions, replacements, or changes of the arrangements may be made without departing from the scope of the present invention. In the description below, those components that are identical to each other are denoted by identical reference signs.

First Embodiment

Figure 1:
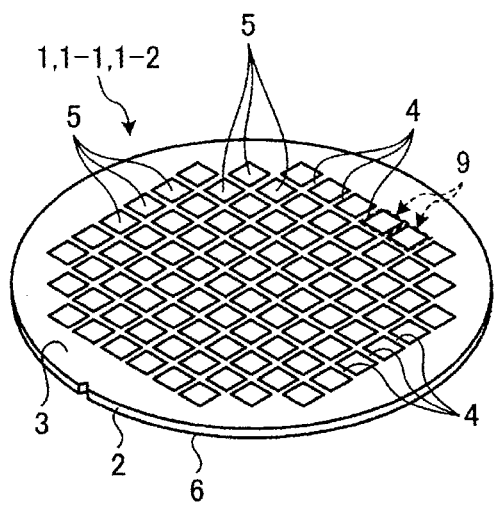
FIG. 1 is a perspective view illustrating, by way of example, a wafer as an object to be processed by a method of manufacturing a layered device chip assembly according to a first embodiment of the present invention.
Figure 2:
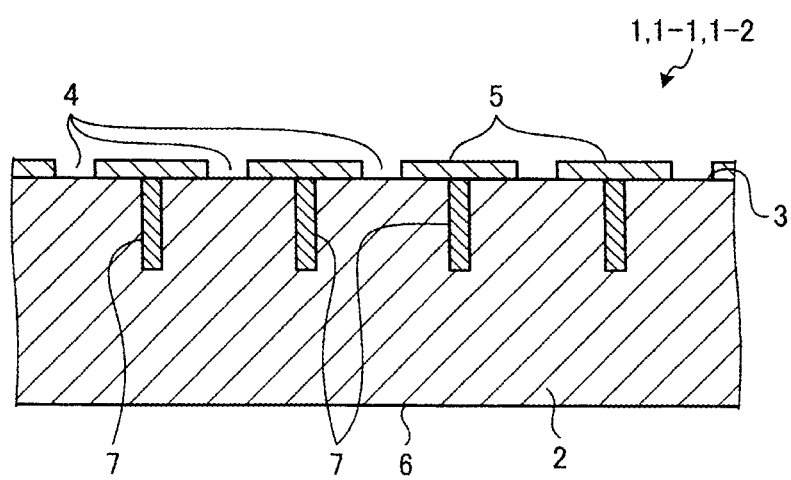
FIG. 2 is an enlarged schematic fragmentary cross-sectional view of an exemplary portion of the wafer illustrated in FIG. 1.
Figure 3:
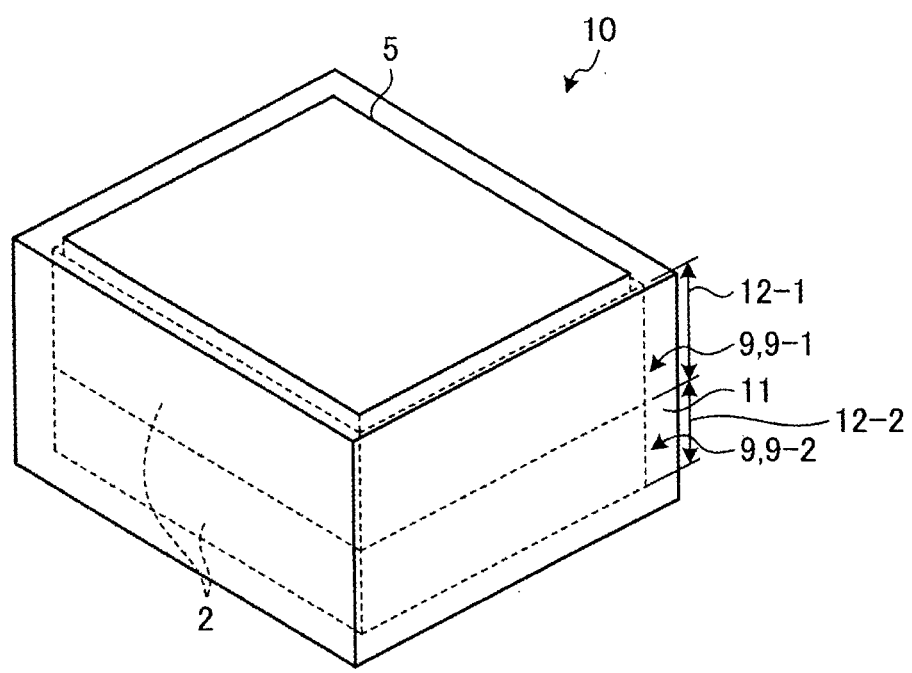
FIG. 3 is a perspective view illustrating, by way of example, a layered device chip assembly manufactured by the method of manufacturing a layered device chip assembly according to the first embodiment.
Figure 4:
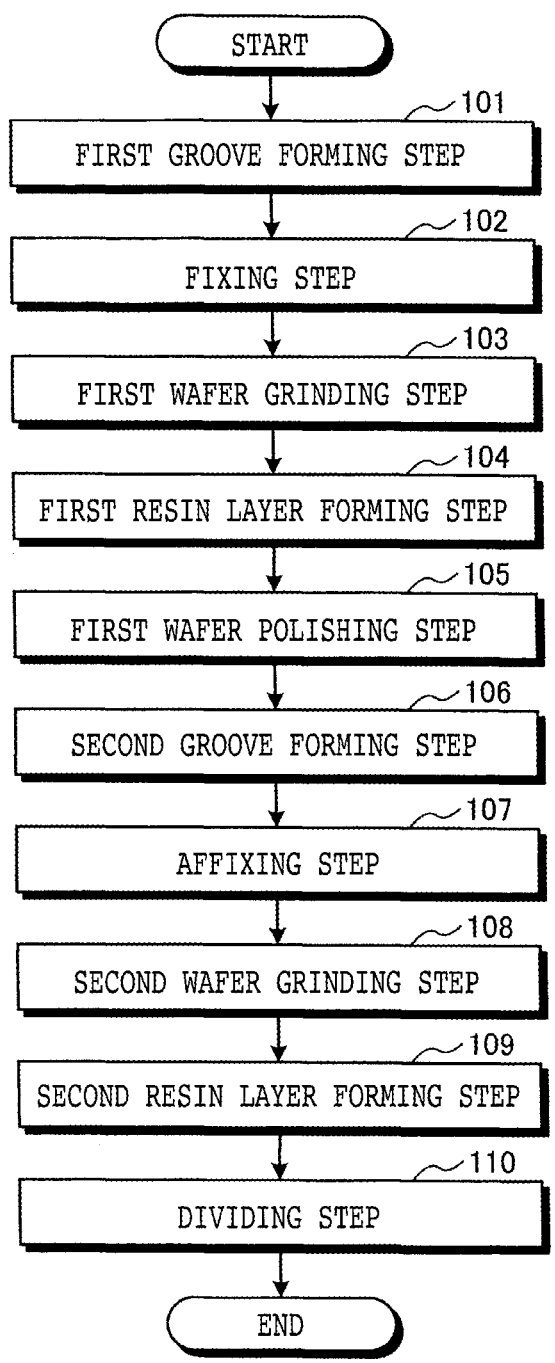
FIG. 4 is a flowchart of a sequence of the method of manufacturing a layered device chip assembly according to the first embodiment.

A method of manufacturing a layered device chip assembly according to a first embodiment of the present invention will be described below with reference to the drawings. FIG. 1 illustrates in perspective, by way of example, a wafer as an object to be processed by the method of manufacturing a layered device chip assembly according to the first embodiment. FIG. 2 illustrates a portion of the wafer illustrated in FIG. 1 in enlarged schematic fragmentary cross section. FIG. 3 illustrates in perspective, by way of example, a layered device chip assembly manufactured by the method of manufacturing a layered device chip assembly according to the first embodiment. FIG. 4 is a flowchart of a sequence of the method of manufacturing a layered device chip assembly according to the first embodiment.

(Wafer)

The method of manufacturing a layered device chip assembly according to the first embodiment is a method of manufacturing a layered device chip assembly 10 illustrated in FIG. 3, from two wafers 1 illustrated in FIGS. 1 and 2. The two wafers 1 will also be referred to as a first wafer 1-1 and a second wafer 1-2, respectively, as described later. According to the first embodiment, each of the wafers 1 includes a semiconductor wafer, an optical device wafer, or the like shaped as a circular plate including a substrate 2 of silicon, sapphire, gallium arsenide, or the like. As illustrated in FIG. 1, the wafer 1 has a face side 3 with a plurality of devices 5 provided in respective areas demarcated on the face side 3 by a plurality of intersecting projected dicing lines 4 established thereon.

The devices 5 include integrated circuits (ICs), large-scale-integration (LSI) circuits, or various memories or semiconductor storage devices. As illustrated in FIG. 2, the wafer 1 has a plurality of through electrodes 7 embedded in the substrate 2 and extending from the face side 3 toward a reverse side 6 of the wafer 1 that is opposite the face side 3. In FIG. 2, each of the devices 5 is connected to one of the through electrodes 7. According to the present invention, however, each of the devices 5 may be connected to a plurality of through electrodes 7.

The wafer 1 will be divided along the projected dicing lines 4 into individual device chips 9 illustrated in FIG. 1. When the wafer 1 is divided into the individual device chips 9, the through electrode 7 in each of the device chips 9 becomes a TSV electrode extending through the substrate 2 between the face side 3 and the reverse side 6 for connection to the devices 5 of other device chips 9. Each of the device chips 9 includes the substrate 2 and the device 5. Those parts of the device chips 9 that are identical to those of the wafer 1 are denoted by identical reference signs and will be omitted from description.

(Layered Device Chip Assembly)

As illustrated in FIG. 3, the layered device chip assembly 10 includes a plurality of (two according to the first embodiment) device chips 9 that are placed one on the other. Except the face side of one of the device chips 9, the side surfaces of both the device chips 9 and the reverse side 6 of the other device chip 9 are covered with a resin layer 11 made of a resin. An upper one of the two device chips 9 of the layered device chip assembly 10 is referred to as a first device chip 9-1, whereas a lower one of the two device chips 9 as a second device chip 9-2, as illustrated in FIG. 3.

(Method of Manufacturing a Layered Device Chip Assembly)

As illustrated in FIG. 4, the method of manufacturing a layered device chip assembly according to the first embodiment includes a first groove forming step 101, a fixing step 102, a first wafer grinding step 103, a first resin layer forming step 104, a first wafer polishing step 105, a second groove forming step 106, an affixing step 107, a second wafer grinding step 108, a second resin layer forming step 109, and a dividing step 110.

(First Groove Forming Step)

Figure 5:
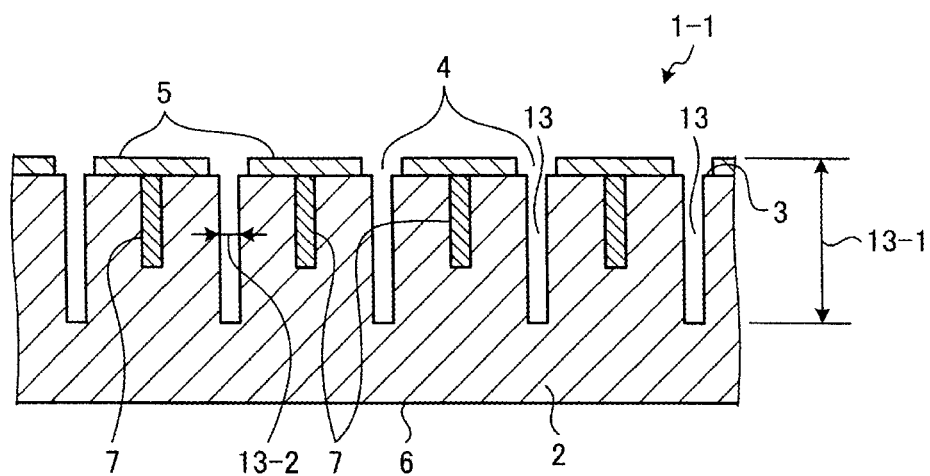
FIG. 5 is an enlarged schematic fragmentary cross-sectional view of an exemplary portion of a first wafer after a first groove forming step of the method of manufacturing a layered device chip assembly illustrated in FIG. 4.

FIG. 5 illustrates, in enlarged schematic fragmentary cross section, an exemplary portion of a first wafer 1-1 after the first groove forming step 101 of the method of manufacturing a layered device chip assembly illustrated in FIG. 4. The first groove forming step 101 is a step of forming first grooves 13 in the first wafer 1-1 along the projected dicing lines 4 on the first wafer 1-1, the first grooves 13 having a depth 13-1 extending from the face side 3 of the first wafer 1-1 beyond a finished thickness 12-1 (see FIG. 3) of the first device chip 9-1.

In the first groove forming step 101, the first wafer 1-1 is prepared as one of the two wafers 1, and a cutting apparatus, not illustrated, holds the reverse side 6 of the first wafer 1-1 under suction on a holding surface of a chuck table thereof, not illustrated. In the first groove forming step 101, while a cutting blade, not illustrated, that is being rotated about its central axis by a spindle of the cutting apparatus and the chuck table are being moved relatively to each other along each of the projected dicing lines 4, the cutting blade is forced to cut into the first wafer 1-1 along the projected dicing lines 4 from the face side 3 thereof to the depth 13-1, forming the first grooves 13 in the first wafer 1-1 along the respective projected dicing lines 4, as illustrated in FIG. 5. The depth 13-1 of the first grooves 13 is smaller than the thickness of the first wafer 1-1, so that the first grooves 13 terminate short of the reverse side 6 of the first wafer 1-1.

Each of the first grooves 13 has a width 13-2 that is constant along its entire length in thicknesswise directions of the first wafer 1-1. According to the present invention, however, the width 13-2 may be progressively smaller from the face side 3 toward the reverse side 6 of the first wafer 1-1. According to the present invention, furthermore, in the first groove forming step 101, a laser processing apparatus, not illustrated, may hold the reverse side 6 of the first wafer 1-1 under suction on a holding surface of a chuck table thereof, not illustrated. While a laser beam applying unit, not illustrated, of the laser beam applying apparatus and the chuck table is being moved relatively to each other along each of the projected dicing lines 4, the laser beam applying unit may apply a laser beam having a wavelength absorbable by the first wafer 1-1 to the first wafer 1-1 along the projected dicing lines 4 from the face side 3 thereof, forming the first grooves 13 in the first wafer 1-1 along the respective projected dicing lines 4.

(Fixing Step)

Figure 6:
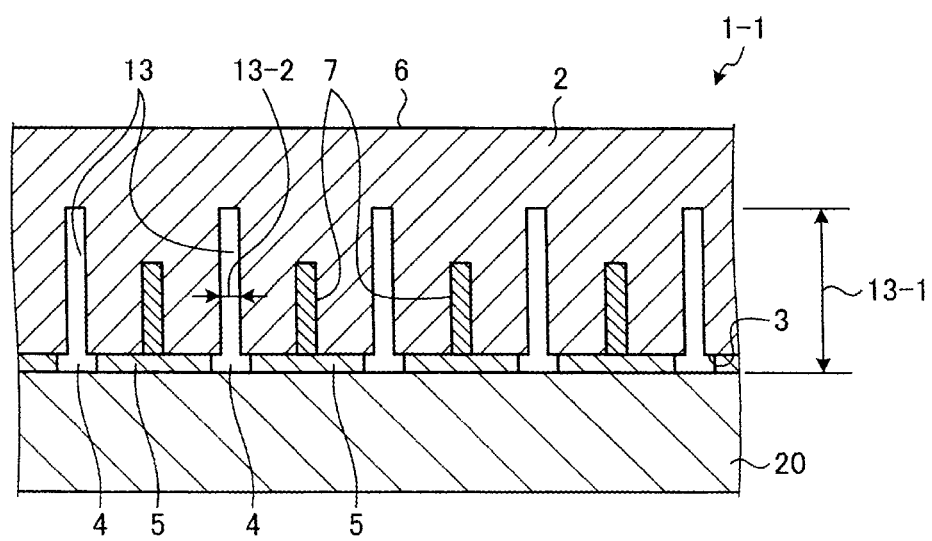
FIG. 6 is an enlarged schematic fragmentary cross-sectional view of an exemplary portion of the first wafer after a fixing step of the method of manufacturing a layered device chip assembly illustrated in FIG. 4.

FIG. 6 illustrates, in enlarged schematic fragmentary cross section, an exemplary portion of the first wafer 1-1 after the fixing step 102 of the method of manufacturing a layered device chip assembly illustrated in FIG. 4. The fixing step 102 is a step of fixing the face side 3 of the first wafer 1-1 to a plate-shaped circular support body 20. According to the first embodiment, in the fixing step 102, as illustrated in FIG. 6, the face side 3 of the first wafer 1-1 is fixed to the support body 20 that is made of a hard material and has a diameter equal to or larger than the diameter of the support body 20 by an adhesive or the like, not illustrated.

According to the first embodiment, in the fixing step 102, the face side 3 of the first wafer 1-1 is fixed to the support body 20 that is made of a hard material. According to the present invention, however, the face side 3 of the first wafer 1-1 may be fixed to a support body including either a flexible tape that includes a base layer of resin and a glue layer of sticky resin or a resin sheet free of a glue layer.

(First Wafer Grinding Step)

Figure 7:
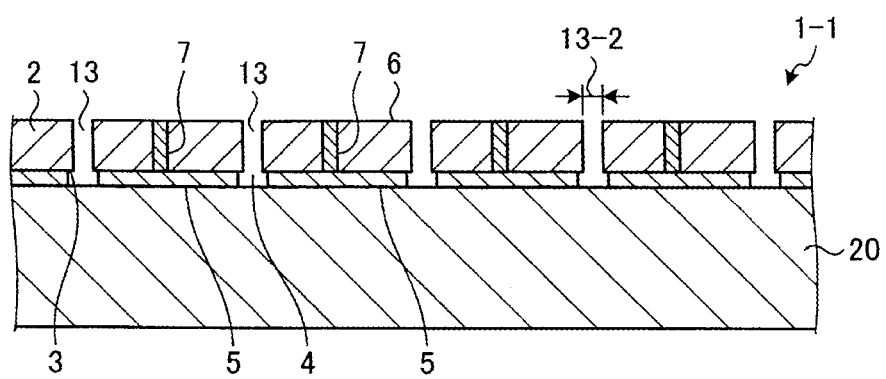
FIG. 7 is an enlarged schematic fragmentary cross-sectional view of an exemplary portion of the first wafer after a first wafer grinding step of the method of manufacturing a layered device chip assembly illustrated in FIG. 4.

FIG. 7 illustrates, in enlarged schematic fragmentary cross section, an exemplary portion of the first wafer 1-1 after the first wafer grinding step 103 of the method of manufacturing a layered device chip assembly illustrated in FIG. 4. The first wafer grinding step 103 is a step of grinding the first wafer 1-1 fixed to the support body 20 from the reverse side 6 thereof to expose the first grooves 13 on the reverse side 6 of the first wafer 1-1.

In the first wafer grinding step 103, a grinding apparatus, not illustrated, holds the face side 3 of the first wafer 1-1 under suction of a holding surface of a chuck table thereof, not illustrated, with the support body 20 interposed between the face side 3 of the first wafer 1-1 and the chuck table. In the first wafer grinding step 103, while a grinding wheel, not illustrated, of the grinding apparatus is being rotated about its central axis by a spindle, the chuck table is being rotated about its central axis, and a grinding fluid nozzle, not illustrated, of the grinding apparatus is supplying a grinding fluid to the first wafer 1-1, grindstones, not illustrated, of the grinding wheel are held in abrasive contact with the reverse side 6 of the substrate 2 of the first wafer 1-1 and pressed toward the chuck table at a predetermined rate, thereby grinding the reverse side 6 of the first wafer 1-1.

According to the first embodiment, in the first wafer grinding step 103, as illustrated in FIG. 7, the grinding apparatus grinds the reverse side 6 of the first wafer 1-1 until the thickness of the first wafer 1-1 is larger than the finished thickness 12-1 of the first device chip 9-1 and smaller than the depth 13-1 of the first grooves 13, as illustrated in FIG. 6. According to the first embodiment, in the first wafer grinding step 103, the grinding apparatus exposes at least the first grooves 13 on the reverse side 6 of the first wafer 1-1.

(First Resin Layer Forming Step)

Figure 8:
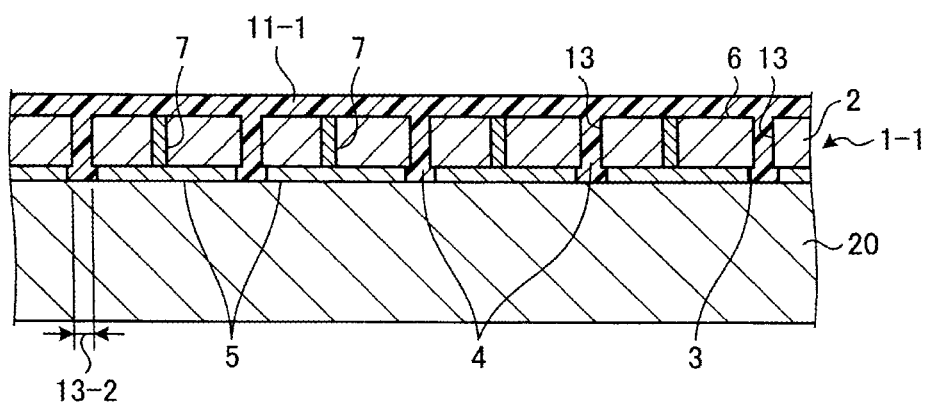
FIG. 8 is an enlarged schematic fragmentary cross-sectional view of an exemplary portion of the first wafer after a first resin layer forming step of the method of manufacturing a layered device chip assembly illustrated in FIG. 4.

FIG. 8 illustrates, in enlarged schematic fragmentary cross section, an exemplary portion of the first wafer 1-1 after the first resin layer forming step 104 of the method of manufacturing a layered device chip assembly illustrated in FIG. 4. The first resin layer forming step 104 is a step of forming a first resin layer 11-1 in the first grooves 13 in the first wafer 1-1 and on the reverse side 6 thereof.

In the first resin layer forming step 104, the grooves 13 in the first wafer 1-1 and the reverse side 6 thereof are supplied with a resin that has been softened by being heated. As a result, as illustrated in FIG. 8, the grooves 13 in the first wafer 1-1 are filled with the first resin layer 11-1, and the reverse side 6 of the first wafer 1-1 is covered with the first resin layer 11-1.

(First Wafer Polishing Step)

Figure 9:
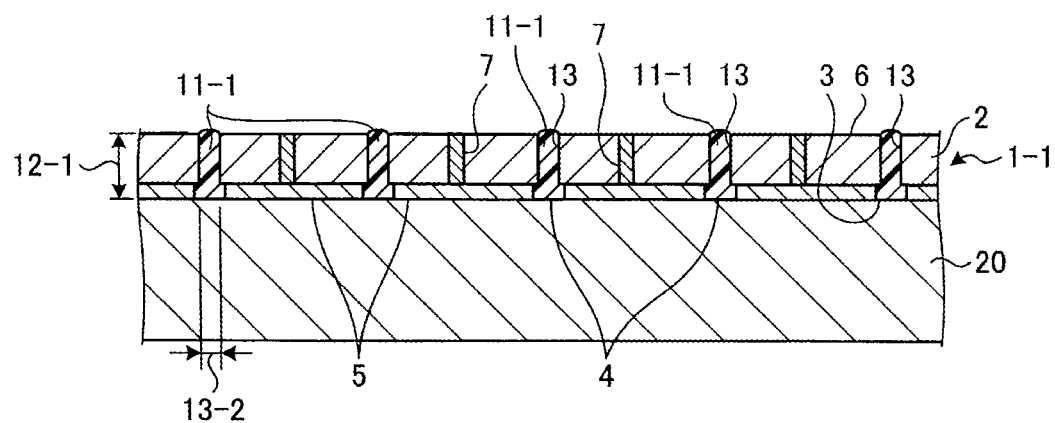
FIG. 9 is an enlarged schematic fragmentary cross-sectional view of an exemplary portion of the first wafer after a first wafer polishing step of the method of manufacturing a layered device chip assembly illustrated in FIG. 4.

FIG. 9 illustrates, in enlarged schematic fragmentary cross section, an exemplary portion of the first wafer 1-1 after the first wafer polishing step 105 of the method of manufacturing a layered device chip assembly illustrated in FIG. 4. The first wafer polishing step 105 is a step of polishing the first wafer 1-1 fixed to the support body 20 and the first resin layer 11-1 thereon simultaneously, thinning down the first wafer 1-1 to a thickness commensurate with the finished thickness 12-1 of the first device chip 9-1 until the reverse side 6 of the first wafer 1-1 is exposed and the through electrodes 7 and the first resin layer 11-1 in the first grooves 13 are also exposed on the reverse side 6 of the first wafer 1-1.

In the first wafer polishing step 105, a polishing apparatus, not illustrated, holds the face side 3 of the first wafer 1-1 under suction of a holding surface of a chuck table thereof, not illustrated, with the support body 20 interposed between the face side 3 of the first wafer 1-1 and the chuck table. In the first wafer polishing step 105, a polishing pad, not illustrated, of the polishing apparatus that is being rotated about its central axis is pressed at a predetermined feed rate toward the chuck table that is being rotated about its central axis, polishing the first resin layer 11-1 on the reverse side 6 of the first wafer 1-1 with a polishing member until the first resin layer 11-1 on the reverse side 6 is removed, exposing the first grooves 13 on the reverse side 6.

According to the first embodiment, in the first wafer polishing step 105, as illustrated in FIG. 9, the polishing apparatus simultaneously polishes the reverse side 6 of the first wafer 1-1 and the first resin layer 11-1 in the first grooves 13, thinning down the first wafer 1-1 until the first wafer 1-1 has a thickness commensurate with the finished thickness 12-1 of the first device chip 9-1. After the first wafer polishing step 105, when the reverse side 6 is no longer pressed by the polishing pad, the first resin layer 11-1 made of resin has portions slightly protruding from the reverse side 6 under recovering forces, as illustrated in FIG. 9.

(Second Groove Forming Step)

Figure 10:
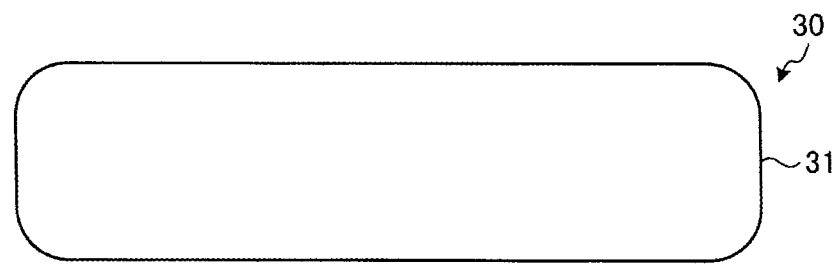
FIG. 10 is an enlarged schematic fragmentary cross-sectional view illustrating a second groove forming step of the method of manufacturing a layered device chip assembly illustrated in FIG. 4.
Figure 10:
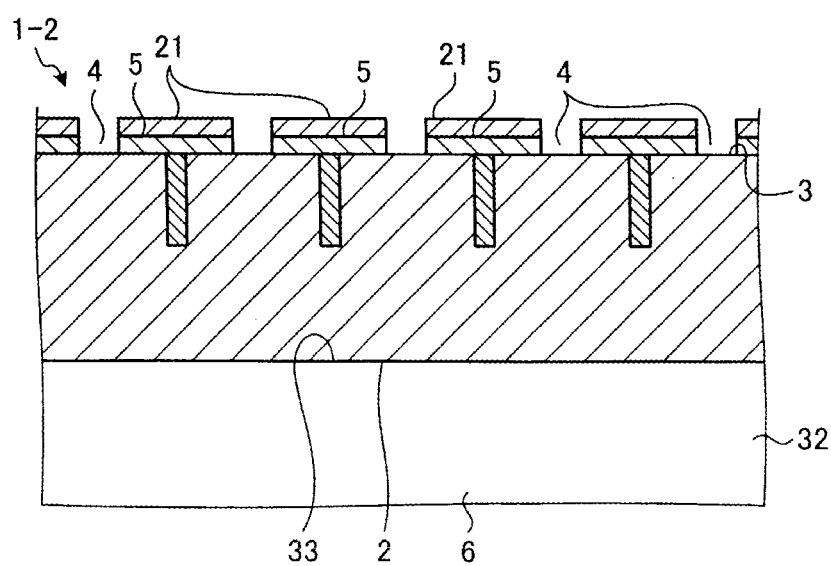
Figure 11:
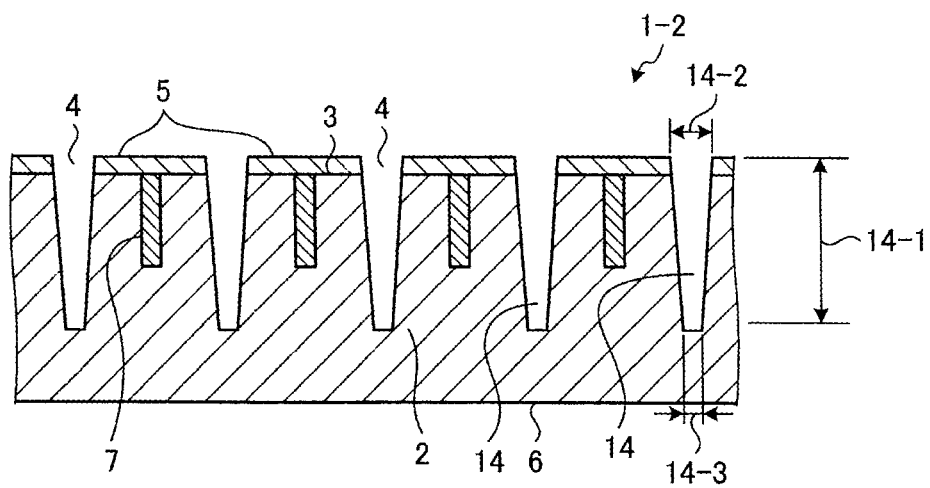
FIG. 11 is an enlarged schematic fragmentary cross-sectional view of an exemplary portion of a second wafer after the second groove forming step of the method of manufacturing a layered device chip assembly illustrated in FIG. 4.

FIG. 10 illustrates, in enlarged schematic fragmentary cross section, the second groove forming step 106 of the method of manufacturing a layered device chip assembly illustrated in FIG. 4. FIG. 11 illustrates, in enlarged schematic fragmentary cross section, an exemplary portion of the second wafer 1-2 after the second groove forming step 106 of the method of manufacturing a layered device chip assembly illustrated in FIG. 4. The second groove forming step 106 is a step of forming second grooves 14 in the second wafer 1-2, which is structurally identical to the first wafer 1-1, along the projected dicing lines 4 from the face side 3 of the second wafer 1-2 to a depth 14-1 beyond a finished thickness 12-2 (see FIG. 3) of the second device chip 9-2. The second grooves 14 have respective groove bottoms that terminate short of the reverse side 6 of the second wafer 1-2. The second grooves 14 has a width 14-2 (see FIG. 11) on the face side 3 that is larger than the width 13-2 (see FIG. 9) of the first grooves 13 in the first wafer 1-1 and a width 14-3 (see FIG. 11) at the groove bottoms that is smaller than the width 14-2.

According to the first embodiment, in the second groove forming step 106, the second safer 102 that is structurally identical to the first wafer 1-1 is prepared as the other of the two wafers 1, and the face side 3 of the second wafer 1-2 is covered with a water-soluble resin. The water-soluble resin is provided as a protective film 21 on the face side 3 of the second wafer 1-2. According to the first embodiment, in the second groove forming step 106, a laser beam is applied to the face side 3 of the second wafer 1-2 along the projected dicing lines 4, removing portions of the protective film 21 along the projected dicing lines 4 to expose portions of the face side 3 along the projected dicing lines 4 and keeping the devices 5 covered with remaining portions of the protective film 21. At this time, the exposed portions of the face side 3 along the projected dicing lines 4 have a width larger than the width 13-2 of the first grooves 13 in the first wafer 1-1. According to the first embodiment, the water-soluble resin includes, for example, polyvinyl alcohol (PVA), polyvinyl pyrrolidone (PVP), or the like. The water-soluble resin provided as the protective film 21 functions as a shield film, i.e., a mask, that is resistant to a plasmatic etching gas 31 illustrated in FIG. 10.

According to the first embodiment, in the second groove forming step 106, a plasma etching apparatus 30 holds the reverse side 6 of the second wafer 1-2 under suction on a holding surface 33 of a chuck table 32 thereof, not illustrated. According to the first embodiment, in the second groove forming step 106, a high-frequency voltage for drawing in the plasmatic etching gas 31 is applied to the chuck table 32, thereby supplying the plasmatic etching gas 31 over the holding surface 33 of the chuck table 32.

In the second groove forming step 106, the supplied plasmatic etching gas 31 etches the substrate 2 from the exposed portions of the face side 3 along the projected dicing lines 4 toward the reverse side 6, forming the second grooves 14 extending from the face side 3 toward the reverse side 6 along the projected dicing lines 4. According to the first embodiment, in the second groove forming step 106, the plasmatic etching gas 31 is continuously supplied while high-frequency electric power is being applied to the chuck table 32 for a predetermined time at a voltage capable of anisotropically etching the substrate 2 of the second wafer 1-2 such that the width of the second grooves 14 will be progressively smaller than the width 14-2 from the face side 3 toward the groove bottoms. The predetermined time is of such a length that the depth 14-1 of the second grooves 14 is smaller than the thickness of the second wafer 1-2 and exceeds the finished thickness 12-2 of the second device chip 9-2. The second grooves 14 may be formed in the second wafer 1-2 by the Bosch process rather than anisotropic etching.

Then, in the second groove forming step 106, as illustrated in FIG. 11, the protective film 21 is removed from the face side 3 of the second wafer 1-2 as by supplying cleaning water to the face side 3 of the second wafer 1-2. In the second groove forming step 106, as described above, the second grooves 14 having the depth 14-1 beyond the finished thickness 12-2 of the second device chip 9-2 are etched in the second wafer 1-2 by the plasmatic etching gas 31. The second grooves 14 has the width 14-2 on the face side 3 that is larger than the width 13-2 of the first grooves 13 in the first wafer 1-1 and the width 14-3 at the groove bottoms that is smaller than the width 14-2.

(Affixing Step)

Figure 12:
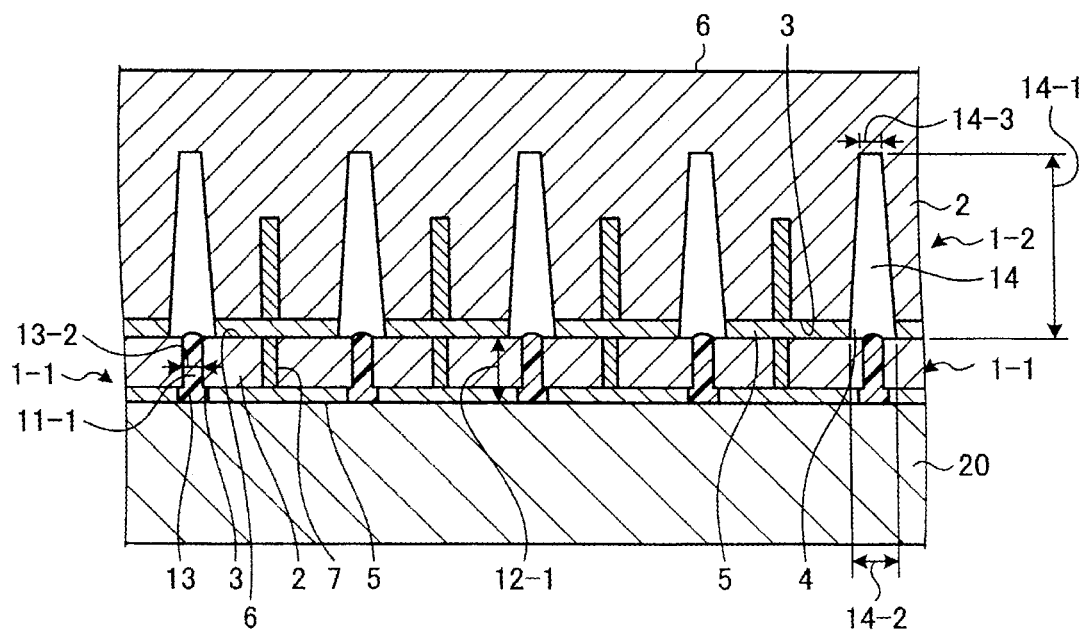
FIG. 12 is an enlarged schematic fragmentary cross-sectional view of exemplary portions of the first wafer and the second wafer after an affixing step of the method of manufacturing a layered device chip assembly illustrated in FIG. 4.

FIG. 12 illustrates, in enlarged schematic fragmentary cross section, exemplary portions of the first wafer 1-1 and the second wafer 1-2 after the affixing step 107 of the method of manufacturing a layered device chip assembly illustrated in FIG. 4. The affixing step 107 is a step of holding the reverse side 6 of the first wafer 1-1 and the face side 3 of the second wafer 102 in facing relation to each other and affixing the second wafer 1-2 to the first wafer 1-1 such that the portions of the first resin layer 11-1 that protrude from the reverse side 6 of the first wafer 1-1 are accommodated in the second grooves 14 in the second wafer 1-2, as illustrated in FIG. 12.

In the affixing step 107, more specifically, the reverse side 6 of the first wafer 1-1 and the face side 3 of the second wafer 102 are held in facing relation to each other with the devices 5 on the first and second wafers 1-1 and 1-2 being aligned with each other, and the reverse side 6 of the first wafer 1-1 and the face side 3 of the second wafer 102 are placed one on the other. The first grooves 13 and the second grooves 14 are also aligned with each other such that the portions of the first resin layer 11-1 that protrude from the reverse side 6 of the first wafer 1-1 are accommodated in the second grooves 14 in the second wafer 1-2. In the affixing step 107, as illustrated in FIG. 12, the reverse side 6 of the first wafer 1-1 and the face side 3 of the second wafer 102 are joined to each other, thereby affixing the second wafer 1-2 to the first wafer 1-1. According to the first embodiment, in the affixing step 107, the through electrodes 7 in the first wafer 1-1 are joined or connected to the devices 5 on the second wafer 1-2.

(Second Wafer Grinding Step)

Figure 13:
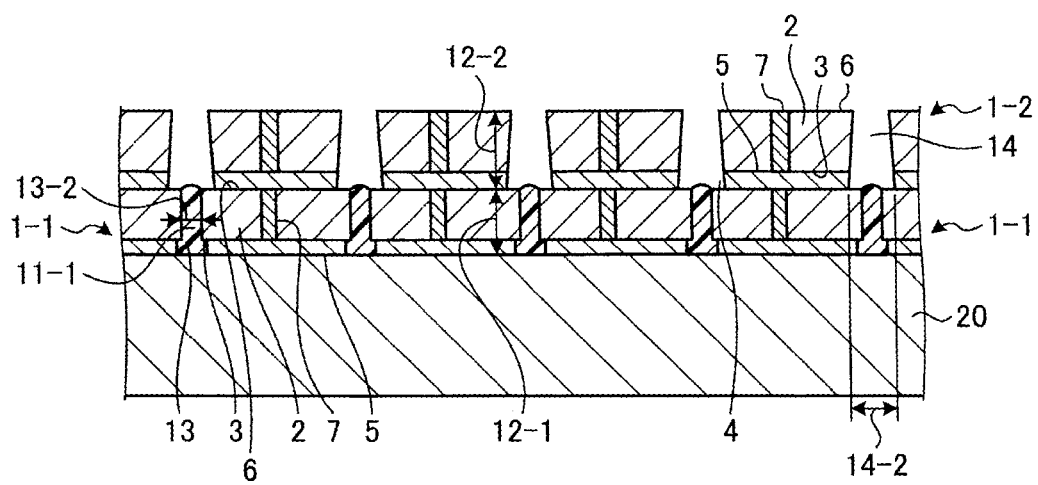
FIG. 13 is an enlarged schematic fragmentary cross-sectional view of exemplary portions of the first wafer and the second wafer after a second wafer grinding step of the method of manufacturing a layered device chip assembly illustrated in FIG. 4.

FIG. 13 illustrates, in enlarged schematic fragmentary cross section, exemplary portions of the first wafer 1-1 and the second wafer 1-2 after the second wafer grinding step 108 of the method of manufacturing a layered device chip assembly illustrated in FIG. 4. The second wafer grinding step 108 is a step of grinding the second wafer 1-2 affixed to the first wafer 1-1 from the reverse side 6 of the second wafer 1-2 until the second grooves 14 are exposed on the reverse side 6 of the second wafer 1-2.

In the second wafer grinding step 108, a grinding apparatus, not illustrated, holds the face side 3 of the first wafer 1-1 under suction of a holding surface of a chuck table thereof, not illustrated, with a support body 20 interposed between the face side 3 of the first wafer 1-1 and the chuck table. In the second wafer grinding step 108, while a grinding wheel, not illustrated, of the grinding apparatus is being rotated about its central axis by a spindle, the chuck table is being rotated about its central axis, and a grinding fluid nozzle, not illustrated, of the grinding apparatus is supplying a grinding fluid to the second wafer 1-2, grindstones, not illustrated, of the grinding wheel are held in abrasive contact with the reverse side 6 of the substrate 2 of the second wafer 1-2 and pressed toward the chuck table at a predetermined rate, thereby grinding the reverse side 6 of the second wafer 1-2.

According to the first embodiment, in the second wafer grinding step 108, as illustrated in FIG. 13, the grindstones continuously grind the reverse side 6 of the second wafer 1-2 until the thickness of the second wafer 1-2 becomes equal to the finished thickness 12-2 of the second device chip 9-2. According to the first embodiment, in the second wafer grinding step 108, therefore, the second grooves 14 and the through electrodes 7 are exposed on the reverse side 6 of the second wafer 1-2.

(Second Resin Layer Forming Step)

Figure 14:
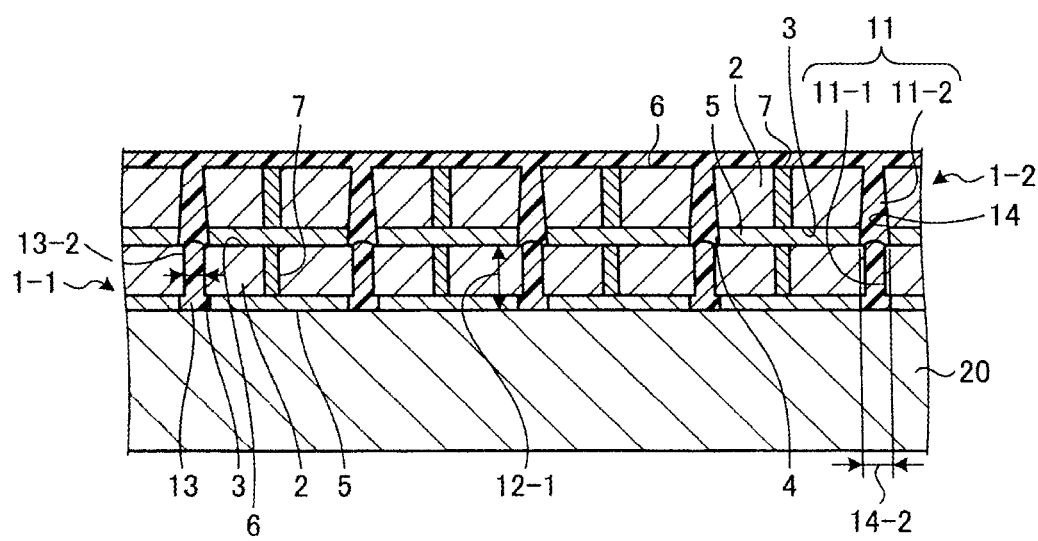
FIG. 14 is an enlarged schematic fragmentary cross-sectional view of exemplary portions of the first wafer and the second wafer after a second resin layer forming step of the method of manufacturing a layered device chip assembly illustrated in FIG. 4.

FIG. 14 illustrates, in enlarged schematic fragmentary cross section, exemplary portions of the first wafer 1-1 and the second wafer 1-2 after the second resin layer forming step 109 of the method of manufacturing a layered device chip assembly illustrated in FIG. 4. The second resin layer forming step 109 is a step of forming a second resin layer 11-2 in the second grooves 14 in the second wafer 1-2 and on the reverse side 6 thereof.

In the second resin layer forming step 109, the second grooves 14 in the second wafer 1-2 and the reverse side 6 thereof are supplied with a resin that has been softened by being heated. As a result, as illustrated in FIG. 14, the second grooves 14 in the second wafer 1-2 are filled with the second resin layer 11-2, and the reverse side 6 of the second wafer 1-2 is covered with the second resin layer 11-2. The first resin layer 11-1 on the first wafer 1-1 and the second resin layer 11-2 on the second wafer 1-2 jointly make up the resin layer 11.

(Dividing Step)

Figure 15:
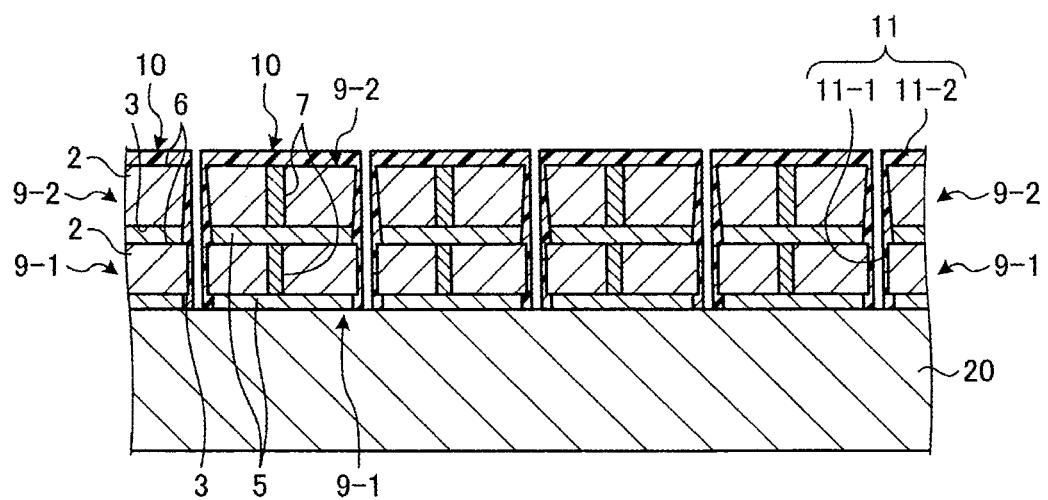
FIG. 15 is an enlarged schematic fragmentary cross-sectional view of exemplary portions of the first wafer and the second wafer after a dividing step of the method of manufacturing a layered device chip assembly illustrated in FIG. 4.

FIG. 15 illustrates, in enlarged schematic fragmentary cross section, exemplary portions of the first wafer 1-1 and the second wafer 1-2 after the dividing step 110 of the method of manufacturing a layered device chip assembly illustrated in FIG. 4. The dividing step 110 is a step of cutting the first resin layer 11-1 and the second resin layer 11-2 respectively along the first grooves 13 and the second grooves 14 to divide the first wafer 1-1 and the second wafer 1-2 into a plurality of layered device chip assemblies 10.

In the dividing step 110, a cutting apparatus, not illustrated, holds the reverse side 6 of the first wafer 1-1 under suction on a holding surface of a chuck table thereof, not illustrated, with a support body 20 interposed between the face side 3 of the first wafer 1-1 and the chuck table. In the dividing step 110, while a cutting blade, not illustrated, that is being rotated about its central axis by a spindle of the cutting apparatus and the chuck table are being moved relatively to each other along each of the projected dicing lines 4, the cutting blade is forced to cut from the reverse side 6 of the second wafer 1-2 into the second wafer 1-2 and the first wafer 1-1 centrally widthwise in the first and second grooves 13 and 14 until the cutting blade reaches the support body 20. In the dividing step 110, as illustrated in FIG. 15, the cutting apparatus cuts the first and second resin layers 11-1 and 11-2 in the first and second grooves 13 and 14 to divide the first and second wafers 1-1 and 1-2 into a plurality of individual layered device chip assemblies 10.

The thickness of the cutting blade used to cut the first and second resin layers 11-1 and 11-2 in the first and second grooves 13 and 14 in the dividing step 110 is smaller than the thickness of the cutting blade used to form the first grooves 13 in the first wafer 1-1 in the first groove forming step 101. The layered device chip assemblies 10 will be picked up from the support body 20.

In the method of manufacturing a layered device chip assembly according to the first embodiment, the width 14-2 of the second grooves 14 on the face side 3 of the second wafer 1-2 to be affixed to the first wafer 1-1 is larger than the width 13-2 of the first grooves 13 in the first wafer 1-1. Therefore, even though the first resin layer 11-1 has portions slightly protruding from the reverse side 6, those protruding portions of the first resin layer 11-1 are accommodated in the second grooves 14 in the second wafer 1-2. Consequently, the protruding portions of the first resin layer 11-1 do not present obstacles to the joining of the first wafer 1-1 and the second wafer 1-2, i.e., the first device chip 9-1 and the second device chip 9-2. As a result, the method of manufacturing a layered device chip assembly according to the first embodiment is advantageous in that it allows the first device chip 9-1 and the second device chip 9-2 to be joined neatly to each other rather than obstructing the joining of the first device chip 9-1 and the second device chip 9-2.

Second Embodiment

Figure 16:
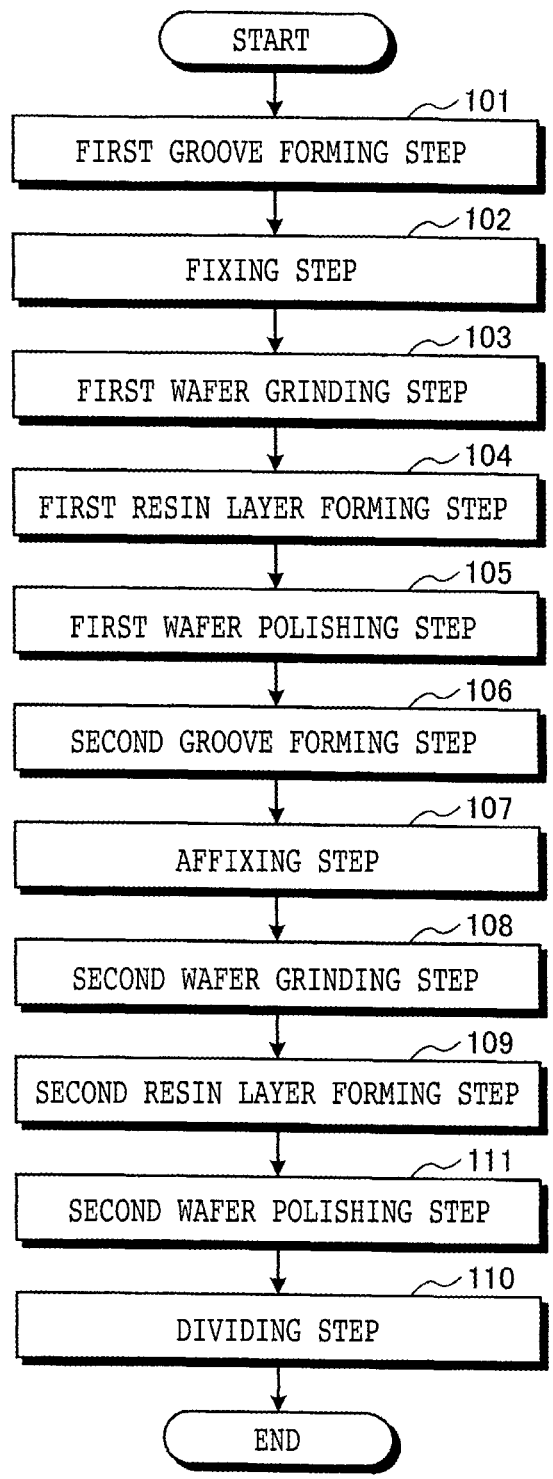
FIG. 16 is a flowchart of a sequence of a method of manufacturing a layered device chip assembly according to a second embodiment of the present invention.
Figure 17:
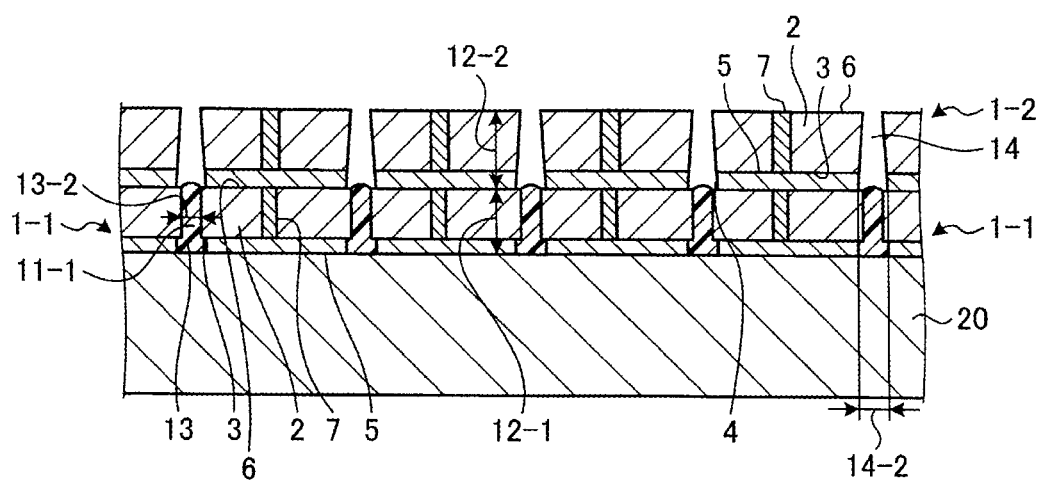
FIG. 17 is an enlarged schematic fragmentary cross-sectional view of exemplary portions of a first wafer and a second wafer after a second wafer grinding step of the method of manufacturing a layered device chip assembly illustrated in FIG. 16.
Figure 18:
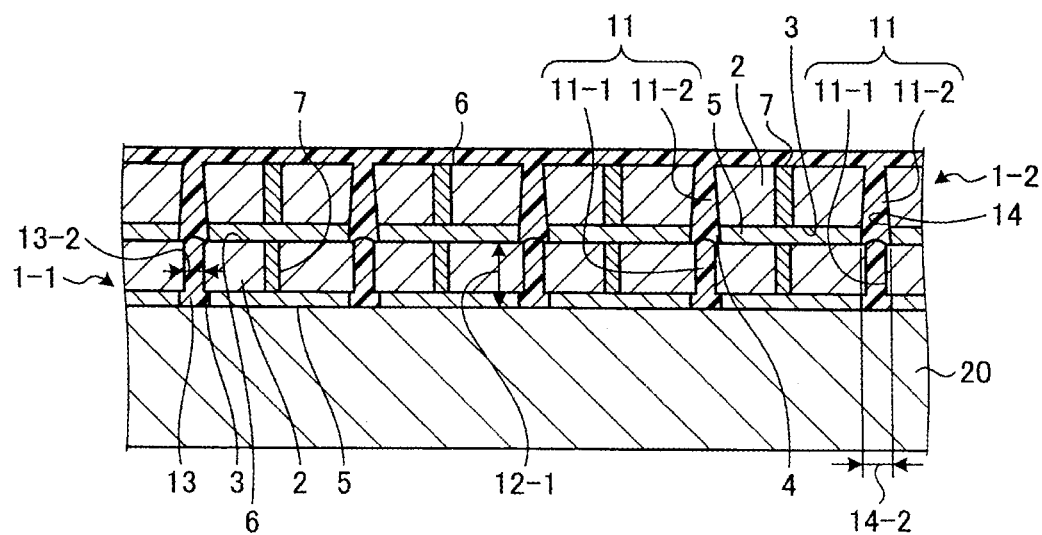
FIG. 18 is an enlarged schematic fragmentary cross-sectional view of exemplary portions of the first wafer and the second wafer after a second resin layer forming step of the method of manufacturing a layered device chip assembly illustrated in FIG. 16.
Figure 19:
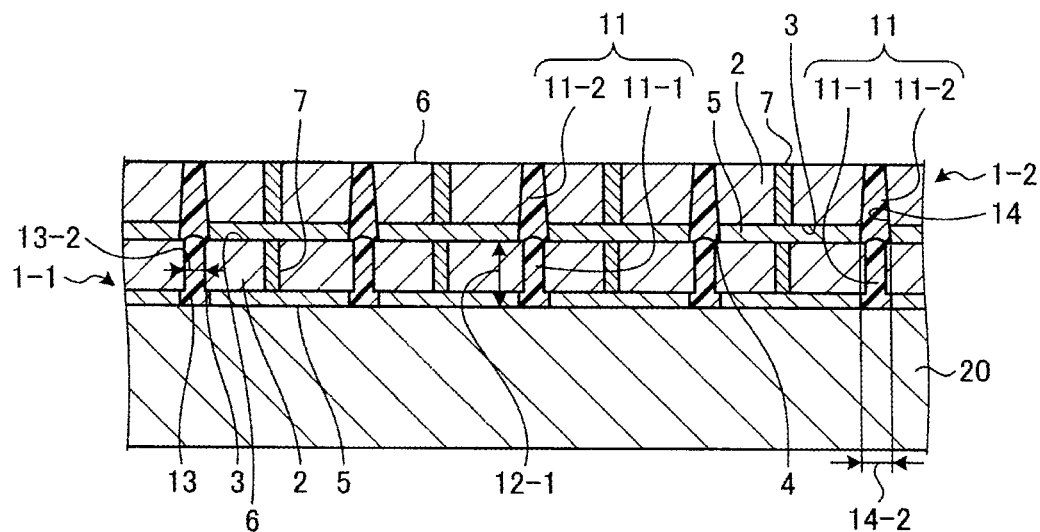
FIG. 19 is an enlarged schematic fragmentary cross-sectional view of exemplary portions of the first wafer and the second wafer after a second polishing step of the method of manufacturing a layered device chip assembly illustrated in FIG. 16.
Figure 20:
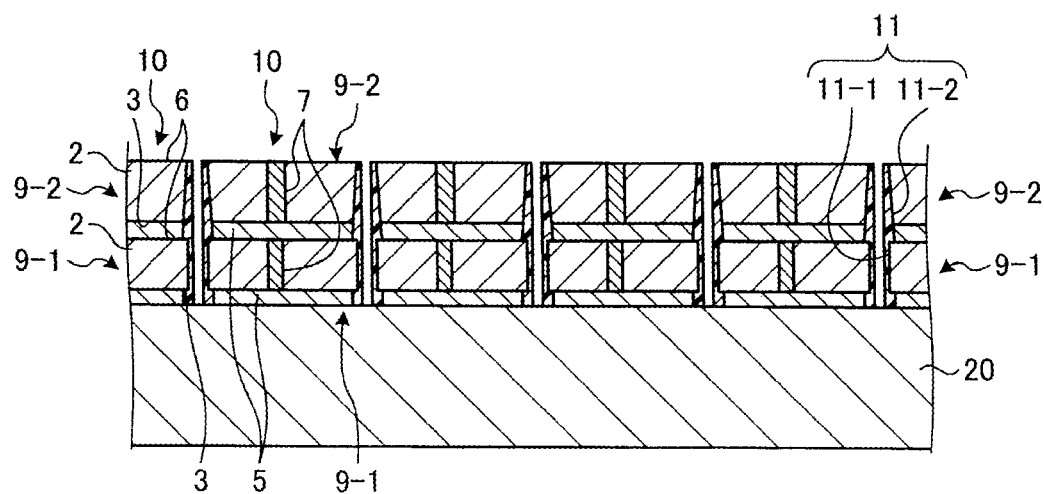
FIG. 20 is an enlarged schematic fragmentary cross-sectional view of exemplary portions of the first wafer and the second wafer after a dividing step of the method of manufacturing a layered device chip assembly illustrated in FIG. 16.

A method of manufacturing a layered device chip assembly according to a second embodiment of the present invention will be described below with reference to the drawings. FIG. 16 is a flowchart of a sequence of the method of manufacturing a layered device chip assembly according to the second embodiment. FIG. 17 illustrates, in enlarged schematic fragmentary cross section, exemplary portions of a first wafer and a second wafer after a second wafer grinding step of the method of manufacturing a layered device chip assembly illustrated in FIG. 16. FIG. 18 illustrates, in enlarged schematic fragmentary cross section, exemplary portions of the first wafer and the second wafer after a second resin layer forming step of the method of manufacturing a layered device chip assembly illustrated in FIG. 16. FIG. 19 illustrates, in enlarged schematic fragmentary cross section, exemplary portions of the first wafer and the second wafer after a second polishing step of the method of manufacturing a layered device chip assembly illustrated in FIG. 16. FIG. 20 illustrates, in enlarged schematic fragmentary cross section, exemplary portions of the first wafer and the second wafer after a dividing step of the method of manufacturing a layered device chip assembly illustrated in FIG. 16. Those components illustrated in FIGS. 16, 17, 18, 19, and 20 that are identical to those according to the first embodiment are denoted by identical reference signs, and will be omitted from description.

The method of manufacturing a layered device chip assembly according to the second embodiment is similar to the method of manufacturing a layered device chip assembly according to the first embodiment except that, as illustrated in FIG. 16, second wafer polishing step 111 is carried out after the second resin layer forming step 109 and before the dividing step 110 to simultaneously polish the second wafer 1-2 fixed to the first wafer 1-1 and the second resin layer 11-2 to thin down the second wafer 1-2 to a thickness commensurate with the finished thickness 12-2 of the second device chip 9-2, and the second wafer grinding step 108 and the dividing step 110 are different from the corresponding steps according to the first embodiment.

In the second wafer grinding step 108 of the method of manufacturing a layered device chip assembly according to the second embodiment, a grinding apparatus, not illustrated, holds the face side 3 of the first wafer 1-1 under suction of a holding surface of a chuck table thereof, not illustrated, with the support body 20 interposed between the face side 3 of the first wafer 1-1 and the chuck table. According to the second embodiment, in the second wafer grinding step 108, as illustrated in FIG. 17, the grinding apparatus grinds the reverse side 6 of the second wafer 1-2 until the thickness of the second wafer 1-2 becomes larger than the finished thickness 12-2 of the second device chip 9-2 and smaller than the depth 15-1 of the second grooves 14. According to the second embodiment, in the second wafer grinding step 108, therefore, the grinding apparatus exposes at least the second grooves 14 on the reverse side 6 of the second wafer 1-2.

In the second resin layer forming step 109 of the method of manufacturing a layered device chip assembly according to the second embodiment, as illustrated in FIG. 18, as with the first embodiment, the second grooves 14 in the second wafer 1-2 are filled with the second resin layer 11-2, and the reverse side 6 of the second wafer 1-2 is covered with the second resin layer 11-2. The first and second resin layers 11-1 and 11-2 jointly make up the resin layer 11.

In second wafer polishing step 111, a polishing apparatus, not illustrated, holds the face side 3 of the first wafer 1-1 under suction of a holding surface of a chuck table thereof, not illustrated, with the support body 20 interposed between the face side 3 of the first wafer 1-1 and the chuck table. In second wafer polishing step 111, a polishing pad, not illustrated, of the polishing apparatus that is being rotated about its central axis is pressed at a predetermined feed rate toward the chuck table that is being rotated about its central axis, polishing the second resin layer 11-2 on the reverse side 6 of the second wafer 1-2 with a polishing member until the second resin layer 11-2 on the reverse side 6 is removed, exposing the reverse side 6 of the second wafer 1-2, the through electrodes 7, and the second grooves 14 on the reverse side 6.

According to the second embodiment, in second wafer polishing step 111, as illustrated in FIG. 19, the polishing apparatus simultaneously polishes the reverse side 6 of the second wafer 1-2 and the second resin layer 11-2 in the second grooves 14, thinning down the second wafer 1-2 until the second wafer 1-2 has a thickness commensurate with the finished thickness 12-2 of the second device chip 9-2.

According to the second embodiment, in the dividing step 110, as with the first embodiment, a cutting apparatus cuts the first and second resin layers 11-1 and 11-2 in the first and second grooves 13 and 14 to divide the first and second wafers 1-1 and 1-2 into a plurality of individual layered device chip assemblies 10-2, as illustrated in FIG. 20. The reverse sides 6 of the second device chips 9-2 of the layered device chip assemblies 10-2 are not covered with the resin layer 11, but exposed.

In the method of manufacturing a layered device chip assembly according to the second embodiment, the width 14-2 of the second grooves 14 on the face side 3 of the second wafer 1-2 to be affixed to the first wafer 1-1 is larger than the width 13-2 of the first grooves 13 in the first wafer 1-1. Therefore, even though the first resin layer 11-1 has portions slightly protruding from the reverse side 6, those protruding portions of the first resin layer 11-1 are accommodated in the second grooves 14 in the second wafer 1-2. Consequently, as with the first embodiment, the protruding portions of the first resin layer 11-1 do not present obstacles to the joining of the first wafer 1-1 and the second wafer 1-2, i.e., the first device chip 9-1 and the second device chip 9-2. As a result, the method of manufacturing a layered device chip assembly according to the second embodiment is advantageous in that it allows the first device chip 9-1 and the second device chip 9-2 to be joined neatly and smoothly to each other rather than obstructing the joining of the first device chip 9-1 and the second device chip 9-2. Furthermore, a face side of a third wafer, not illustrated, that is similar to the first and second wafers 1-1, 1-2 and has grooves similar to the second grooves 14 in the second wafer 1-2 may be joined to the reverse side 6 of the second wafer 1-2 that has been joined to the first wafer 1-1, thereby forming a layered device chip assembly made up of three device chips 9.

[First Modification]

Figure 21:
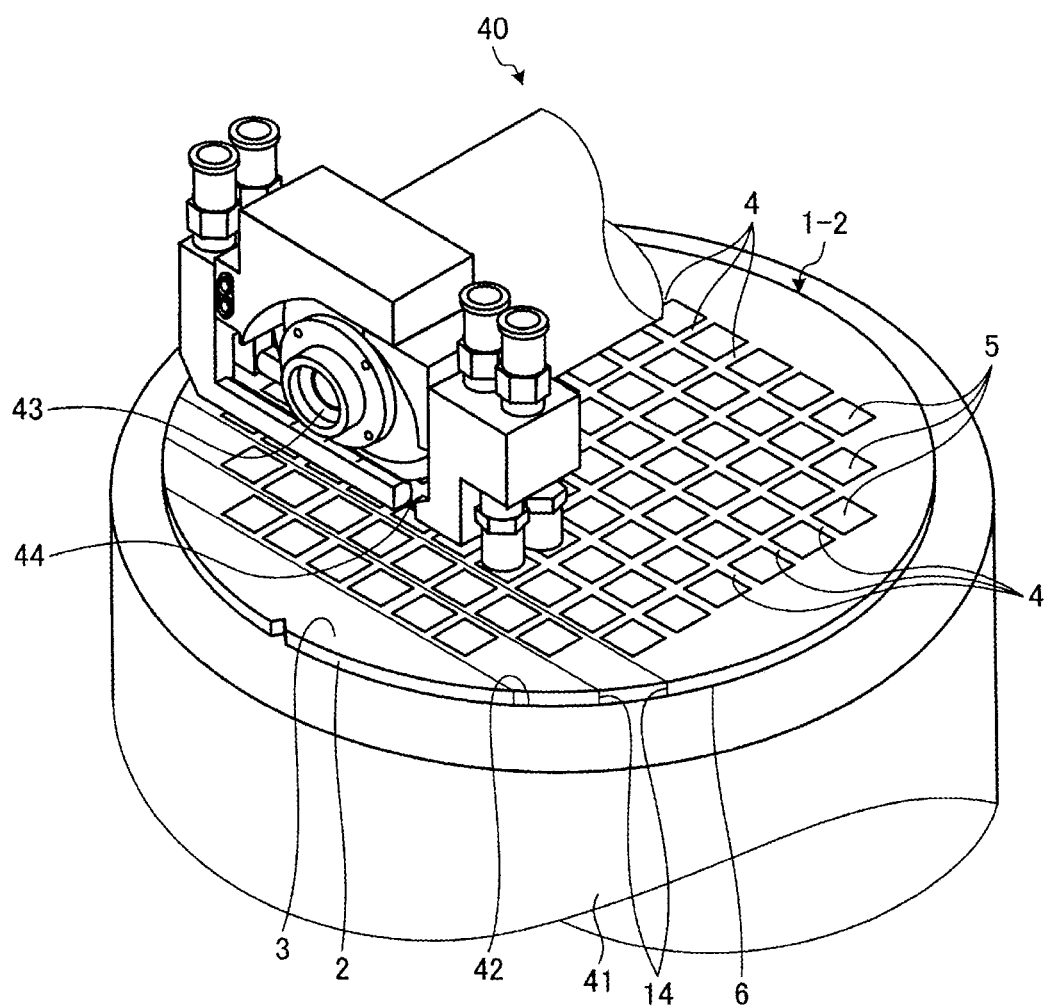
FIG. 21 is a perspective view schematically illustrating a second groove forming step of a method of manufacturing a layered device chip assembly according to a first modification of the first and second embodiments.

A method of manufacturing a layered device chip assembly according to a first modification of the first and second embodiments will be described below with reference to the drawings. FIG. 21 schematically illustrates in perspective a second groove forming step of the method of manufacturing a layered device chip assembly according to the first modification of the first and second embodiments. Those components illustrated in FIG. 21 that are identical to those according to the first embodiment are denoted by identical reference signs, and will be omitted from description.

The method of manufacturing a layered device chip assembly according to the first modification is similar to the methods according to the first and second embodiments except that the second groove forming step 106 is different. According to the first modification, in the second groove forming step 106, a cutting apparatus 40 holds the reverse side 6 of the second wafer 1-2 under suction on a holding surface 42 of a chuck table 41. While a circular cutting blade 44 that is being rotated about its central axis by a spindle 43 and the chuck table 41 are being moved relatively to each other along the projected dicing lines 4, the cutting blade 44 is forced to cut into the second wafer 1-2 from the face side 3 thereof along the projected dicing lines 4 to the depth 14-1, thereby forming the second grooves 14 in the second wafer 1-2 along the projected dicing lines 4, as illustrated in FIG. 21. The cutting blade 44 has a cutting edge that is progressively thinner radially outwardly. According to the second embodiment, in the second groove forming step 106, therefore, the second grooves 14 are formed in the second wafer 1-2 by a cutting process using the cutting blade 44.

According to the first modification, since the width 14-2 of the second grooves 14 on the face side 3 of the second wafer 1-2 is larger than the width 13-2 of the first grooves 13 in the first wafer 1-1, as with the first and second embodiments, the portions of the first resin layer 11-1 that protrude from the reverse side 6 of the first wafer 1-1 are accommodated in the second grooves 14 in the second wafer 1-2 and hence do not present obstacles to the joining of the first wafer 1-1 and the second wafer 1-2, i.e., the first device chip 9-1 and the second device chip 9-2. As a result, the method of manufacturing a layered device chip assembly according to the first modification is advantageous in that it allows the first device chip 9-1 and the second device chip 9-2 to be joined neatly and smoothly to each other rather than obstructing the joining of the first device chip 9-1 and the second device chip 9-2.

[Second Modification]

Figure 22:
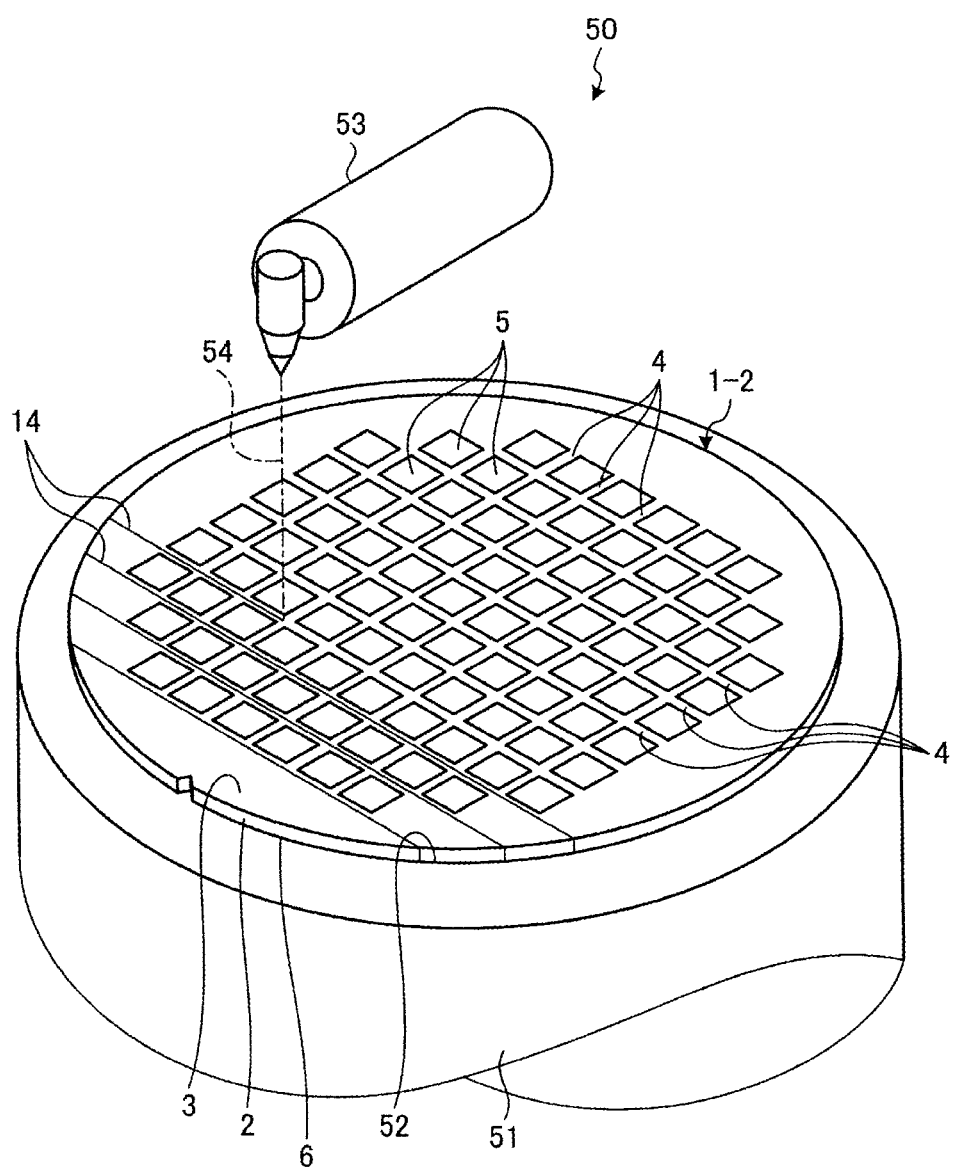
FIG. 22 is a perspective view schematically illustrating a second groove forming step of a method of manufacturing a layered device chip assembly according to a second modification of the first and second embodiments.

A method of manufacturing a layered device chip assembly according to a second modification of the first and second embodiments will be described below with reference to the drawings. FIG. 22 schematically illustrates in perspective a second groove forming step of the method of manufacturing a layered device chip assembly according to the second modification of the first and second embodiments. Those components illustrated in FIG. 22 that are identical to those according to the first embodiment are denoted by identical reference signs, and will be omitted from description.

The method of manufacturing a layered device chip assembly according to the second modification is similar to the methods according to the first and second embodiments except that the second groove forming step 106 is different. According to the second modification, in the second groove forming step 106, a laser processing apparatus 50 holds the reverse side 6 of the second wafer 1-2 under suction on a holding surface 52 of a chuck table 51. While a laser beam applying unit 53 and the chuck table 51 are being moved relatively to each other along the projected dicing lines 4, the laser beam applying unit 53 applies a laser beam 54 having a wavelength absorbable by the second wafer 1-2 to the face side 3 of the second wafer 1-2 along the projected dicing lines 4, thereby forming the second grooves 14 in the second wafer 1-2 along the projected dicing lines 4, as illustrated in FIG. 22. According to the second embodiment, in the second groove forming step 106, therefore, the second grooves 14 are formed in the second wafer 1-2 by a laser processing process using the laser beam 54.

According to the second modification, since the width 14-2 of the second grooves 14 on the face side 3 of the second wafer 1-2 is larger than the width 13-2 of the first grooves 13 in the first wafer 1-1, as with the first and second embodiments, the portions of the first resin layer 11-1 that protrude from the reverse side 6 of the first wafer 1-1 are accommodated in the second grooves 14 in the second wafer 1-2 and hence do not present obstacles to the joining of the first wafer 1-1 and the second wafer 1-2, i.e., the first device chip 9-1 and the second device chip 9-2. As a result, the method of manufacturing a layered device chip assembly according to the second modification is advantageous in that it allows the first device chip 9-1 and the second device chip 9-2 to be joined neatly and smoothly to each other rather than obstructing the joining of the first device chip 9-1 and the second device chip 9-2.

[Third Modification]

Figure 23:
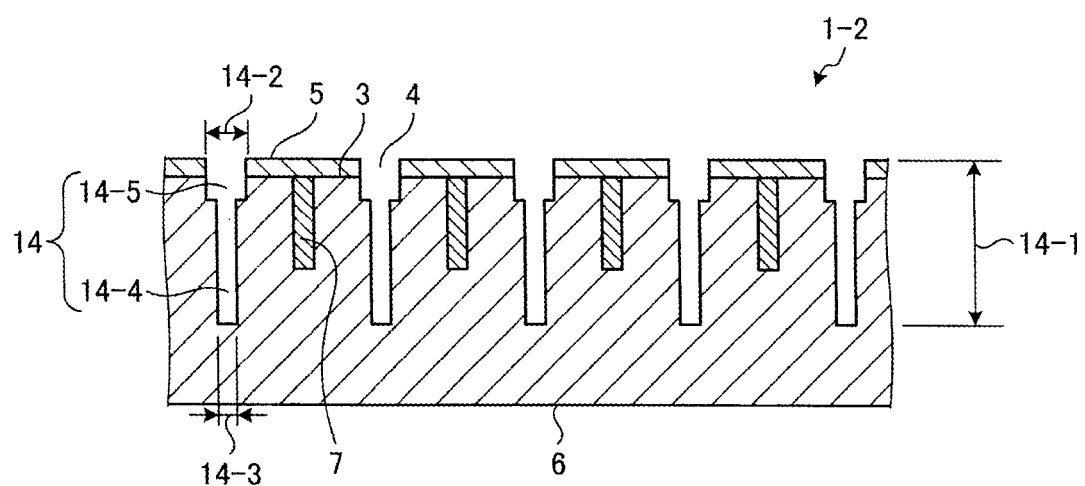
FIG. 23 is an enlarged schematic fragmentary cross-sectional view of an exemplary portion of a second wafer after a second groove forming step of a method of manufacturing a layered device chip assembly according to a third modification of the first and second embodiments.

A method of manufacturing a layered device chip assembly according to a third modification of the first and second embodiments will be described below with reference to the drawings. FIG. 23 illustrates, in enlarged schematic fragmentary cross section, an exemplary portion of a second wafer after a second groove forming step of the method of manufacturing a layered device chip assembly according to the third modification of the first and second embodiments. Those components illustrated in FIG. 23 that are identical to those according to the first embodiment are denoted by identical reference signs, and will be omitted from description.

The method of manufacturing a layered device chip assembly according to the third modification is similar to the methods according to the first and second embodiments except that the second groove forming step 106 is different. According to the third modification, in the second groove forming step 106, a cutting apparatus, not illustrated, having two cutting blades, hereinafter referred to as a first cutting blade and a second cutting blade, holds the reverse side 6 of the second wafer 1-2 under suction on a holding surface of a chuck table thereof, not illustrated. While the first cutting blade that is being rotated about its central axis by a spindle and the chuck table are being moved relatively to each other along the projected dicing lines 4, the first cutting blade is forced to cut into the second wafer 1-2 from the face side 3 along the projected dicing lines 4 to the depth 14-1.

According to the third modification, in the second groove forming step 106, the second cutting blade is then forced to cut into the second wafer 1-2 from the face side 3 along the projected dicing lines 4 to a depth smaller than the depth 14-1 while the second cutting blade that is being rotated about its central axis by a spindle and the chuck table are being moved relatively to each other along the projected dicing lines 4. According to the third modification, the thickness of the cutting edge of the first cutting blade is equal to the width 14-3 and constant radially, whereas the thickness of the cutting edge of the second cutting blade is equal to the width 14-2 and constant radially. Consequently, the first and second cutting blades that successively cut into the second wafer 1-2 form stepped second grooves 14 in the second wafer 1-2. Specifically, each of the stepped second grooves 14 includes a narrower groove 14-4 having a depth 14-1 and a width 14-3 and a wider groove 14-5 having a depth smaller than the depth 14-1 and a width 14-2, the wider groove 14-5 being contiguous to the narrower groove 14-4 closely to the face side 3. The width 14-2 on the face side 3 is larger than the width 13-2 of the first grooves 13 in the first wafer 1-1, and the width 14-3 at the groove bottom is smaller than the width 14-2 on the face side 3.

According to the third modification, since the width 14-2 of the second grooves 14 on the face side 3 of the second wafer 1-2 is larger than the width 13-2 of the first grooves 13 in the first wafer 1-1, as with the first and second embodiments, the portions of the first resin layer 11-1 that protrude from the reverse side 6 of the first wafer 1-1 are accommodated in the second grooves 14 in the second wafer 1-2 and hence do not present obstacles to the joining of the first wafer 1-1 and the second wafer 1-2, i.e., the first device chip 9-1 and the second device chip 9-2. As a result, the method of manufacturing a layered device chip assembly according to the first modification is advantageous in that it allows the first device chip 9-1 and the second device chip 9-2 to be joined neatly and smoothly to each other rather than obstructing the joining of the first device chip 9-1 and the second device chip 9-2.

The present invention is not limited to the above embodiments and modifications. Various changes and modifications can be made in the embodiments and modifications without departing from the scope of the invention. For example, the first groove forming step 101 may be carried out according to a plasma etching process performed by the plasma etching apparatus 30 in the second groove forming step 106. Moreover, a grinding step of grinding the first resin layer 11-1 on the reverse side 6 of the first wafer 1-1 may be carried out between the first resin layer forming step 104 and the first wafer polishing step 105.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a layered device chip assembly of layered device chips from first and second wafers that are structurally identical to each other and each have a plurality of devices formed respectively in areas demarcated on a face side thereof by a plurality of intersecting projected dicing lines, the method comprising:
    a first groove forming step of forming first grooves in the first wafer along the projected dicing lines thereon to a depth beyond a finished thickness of a first device chip;
    a fixing step of fixing the face side of the first wafer to a support body;
    a first wafer grinding step of grinding the first wafer fixed to the support body from a reverse side thereof to expose the first grooves on the reverse side of the first wafer;
    a first resin layer forming step of forming a first resin layer in the first grooves in the first wafer;
    a first wafer polishing step of simultaneously polishing the first wafer fixed to the support body and the first resin layer to thin down the first wafer to a thickness commensurate with the finished thickness of the first device chip to expose the first resin layer in the first grooves on the reverse side of the first wafer;
    a second groove forming step of forming second grooves in the second wafer from the face side thereof along the projected dicing lines thereon to a depth beyond a finished thickness of a second device chip, the second groove having a width on the face side of the second wafer that is larger than a width of the first grooves and a width at groove bottoms that is smaller than the width on the face side of the second wafer;
    an affixing step of holding the reverse side of the polished first wafer and the face side of the second wafer in facing relation to each other and affixing the second wafer to the first wafer such that portions of the first resin layer that protrude from the reverse side of the first wafer are accommodated in the second grooves in the second wafer;
    a second wafer grinding step of grinding the second wafer affixed to the first wafer from the reverse side of the second wafer to expose the second grooves on the reverse side of the second wafer;
    a second resin layer forming step of forming a second resin layer in the second grooves in the second wafer; and
    a dividing step of cutting the first resin layer and the second resin layer along the first grooves and the second grooves to divide the first wafer and the second wafer into a plurality of layered device chip assemblies.

2. The method of manufacturing a layered device chip assembly according to claim 1, wherein the second groove forming step includes a step of forming the second grooves according to a plasma etching process using a plasmatic gas, a cutting process using a cutting blade, or a laser processing process using a laser beam.

3. The method of manufacturing a layered device chip assembly according to claim 1, further comprising:
    after the second resin layer forming step and before the dividing step, a second wafer polishing step of simultaneously polishing the second wafer affixed to the first wafer and the second resin layer to thin down the second wafer to a thickness commensurate with the finished thickness of the second device chip.

* * * * *